(12) United States Patent
Suzuki (10) Patent No.: US 7,259,570 B1
(45) Date of Patent: Aug. 21, 2007

(54) MAGNETIC SIGNAL MEASUREMENT APPARATUS

(75) Inventor: Daisuke Suzuki, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/447,086

(22) Filed: Jun. 6, 2006

(30) Foreign Application Priority Data

Jun. 10, 2005 (JP) .............................. 2005-170300

(51) Int. Cl.
*G01R 27/28* (2006.01)
(52) U.S. Cl. ...................................... 324/627
(58) Field of Classification Search ................ 324/627, 324/628
See application file for complete search history.

(56) References Cited

U.S. PATENT DOCUMENTS 6,114,860 A * 9/2000 Yun ............................ 324/637

FOREIGN PATENT DOCUMENTS

| JP | 06-97696 | 7/1992 |
|---|---|---|
| JP | 9-214166 | 1/1996 |
| JP | 11-128193 | 10/1997 |
| JP | 2002-125946 | 10/2000 |
| JP | 2002-136492 | 10/2000 |
| JP | 2004-177363 | 11/2002 |
| JP | 2005-131149 | 10/2003 |
| JP | 2005-296669 | 6/2005 |

* cited by examiner

*Primary Examiner*—Vincent Q. Nguyen
(74) *Attorney, Agent, or Firm*—Reed Smith LLP; Stanley P. Fisher, Esq.; Juan Carlos A. Marquez, Esq.

(57) ABSTRACT

As the length of a cylinder of a magnetically shielding apparatus is shorter, the amount of magnetism of a component perpendicular to an axis of the cylinder which enters the opening portion of the cylinder is larger, resulting in a lower magnetic shield effect. A second magnetically shielding apparatus is formed in a cylinder with both ends or one direction close to an object to be measured being opened, and is disposed within a first magnetically shielding apparatus. An axial direction of the cylinder is substantially parallel to the magnetic flux density detection direction. The magnetic sensor, which conducts magnetic signal measurement and is disposed within the cylinder, is in the first magnetically shielding apparatus formed in a cylinder having both open ends, to thereby shield a magnetic flux density component that cannot be shielded by the first magnetically shielding apparatus by the periphery of the magnetic sensor.

9 Claims, 11 Drawing Sheets

MAGNETIC SIGNAL MEASUREMENT APPARATUS

CLAIM OF PRIORITY

The present application claims priority from Japanese application JP 2005-170300 filed on Jun. 10, 2005, the content of which is hereby incorporated by reference into this application.

FIELD OF THE INVENTION

The present invention relates to a magnetic signal measurement apparatus that measures a faint magnetism or electromagnetic wave signal by using a magnetic sensor or an electromagnetic field sensor.

BACKGROUND OF THE INVENTION

As usual, a magnetic shield is realized by perfectly covering an area that is sufficiently larger than a measured area with a high permeability material. However, in this case, in a device that measures magnetism generated from a human body, because a space that is larger than the human body is covered with a high permeability, a large space that is 2 m×2 m×2 m (depth, width, height) is required (for example, Non-Patent Document 1:IEEE Tran. MAG. Vol. MAG-18, No. 1, pp. 260-270, Jan.). A magnetically shielding apparatus obtains a high magnetic shield effect, but suffers from such a problem that a large location space is required, for example, in the case where the magnetically shielding apparatus is located within a hospital, the hospital is limited to a large hospital. Also, since the magnetically shielding apparatus completely constitutes a closed space, there is an adverse effect that the apparatus increasingly makes things psychogenic uncomfortable for a person to be examined.

Under the circumstances, as another method, there has been reported a magnetically shielding apparatus in which circular cylinders which are different in diameter from each other and made of a plurality of high permeability materials are sequentially concentrically arranged, and gaps are defined between the respective adjacent cylinders (Patent Document 1: JP-A No. 214166/1997). The cylinders that are open at both ends thereof and made of the high permeability materials are coaxially combined together, thereby making it possible to solve such a problem that the occupied space is large.

In Patent Document 1, there is a disclosure that a large number of permalloy plates which are made of a high permeability alloy material of Ni—Fe base are used to fabricate a magnetically shielded room such as a prefab room as the conventional art. The conventional art suffers from such a problem that a long time is required for fabrication of the magnetic shield, the number of parts used in the magnetic shield is large, and the magnetic shield becomes very expensive. Patent Document 1 discloses that a rate of the price occupied by the magnetic shield with respect to the price of the biologic magnetic signal measurement apparatus is large, and it is desirable to reduce the costs of the magnetic shield.

Also, there has been reported a technique by which in order to obtain the higher magnetic shield effect within the magnetically shielding apparatus disclosed in Non-Patent Document 1, a partial space within the magnetically shielding apparatus is covered with the high permeability magnetic body to enhance the magnetic shield effect of the partial space (Patent Document 2: JP-A No. 128193/1999). In addition, in Non-Patent Document 1 and Patent Documents 1, 2, the high permeability material is employed as the magnetically shielding technique. On the contrary, there has been reported a magnetically shielding apparatus using a superconducting cylinder that does not transmit a magnetism at all (Patent Document 3: JP-A No. 97696/1994).

In Patent Document 3, the superconducting cylinder that is open at both ends thereof is used, and both of those open ends are closed by superconducting plates, respectively. In the case where the superconductor is used as the magnetic shield material, it is necessary to make a superconducting state. As a result, there arise the following problems. Because a cooling mechanism is required, the device is prevented from being complicated increased in the size. Also, because the opening portions are closed, the entrance into and exit from the cylinder become troublesome, and a narrow closed space is provided.

SUMMARY OF THE INVENTION (1) Patent Document 1 suffers from such a problem that the magnetic shield effect of a magnetic component in the axial direction of the cylinder is lower than the magnetic shield effect in a direction perpendicular to the axis of the cylinder because both ends of the cylinder are open. In particular, there arises such a problem that when a length of the cylinder is shorter than twice of a diameter of the opening portion of the cylinder, the amount of magnetic components perpendicular to the axis of the cylinder which enter from the opening portions of the cylinder becomes large, and the magnetic shield effect becomes low.

(2) Also, Patent Document 2 suffers from such a problem that the high permeability material is disposed in the vicinity of a measurement portion, to thereby shield an external magnetic signal, but a measurement signal per se which is an original purpose of the document is distorted. In particular, because a signal from a sensor that is disposed in the vicinity of the high permeability material is bent toward the high permeability material, there arises such problems that a two-dimensional distribution pattern is changed, or an error occurs in a positional estimate in the case where a magnetic flux density distribution is measured by using a large number of sensors, or in the case where a signal source is estimated from the distribution.

In the present invention, in a first magnetically shielding apparatus having a cylindrical configuration with both ends that measure a magnetic signal and are open, a second magnetically shielding apparatus is formed in a cylindrical configuration with both ends or one end that is closer to an object to be measured being open, has a cylindrical axial direction substantially in parallel to the magnetic flux density detection direction, is disposed within the first magnetically shielding apparatus, and includes a magnetic sensor in the interior of the cylinder. With the above structure, a magnetic flux density component that cannot be shielded by the first magnetically shielding apparatus is shielded at the periphery of the magnetic sensor.

(1) In particular, in the case where the first magnetically shielding apparatus is formed in the cylindrical configuration with both ends being open, the sensor is arranged in a direction of measuring a magnetic flux density in a direction substantially perpendicular to the cylindrical axis of the main magnetically shielding apparatus. In situation, in the case where a length of the main magnetic shield cylinder is twice or less as long as the diameter of the cylinder, the magnetically shielding apparatus cannot sufficiently shield a component perpendicular to the axis of the cylinder which enters the cylinder from the opening end of the cylinder. Under the circumstances, the second magnetic shield cylinder covers the sensor in an arrangement where the axis of the second magnetic shield cylinder is perpendicular to the axis of the first magnetic shield cylinder, to thereby magnetically shield the magnetic flux density that enters the cylinder. It is possible that the second magnetic shield cylinder is structured by coaxially combining plural cylinders that are different in the diameter from each other together.

(2) Also, because a magnetic component that is generated from an object to be measured is close to the second magnetic shield cylinder, the magnetic component is bent toward a high permeability magnetic material direction that constitutes the second magnetic shield cylinder as the magnetic component approaches the axis of the second magnetic shield cylinder. In particular, in the case where a measurement surface on which the measurement sensor is mounted is disposed at the inner side of the cylinder from the opening end portion of the second magnetic shield cylinder, the measured magnetic flux density of a peripheral sensor that is close to a wall of the second magnetic shield cylinder is largely distorted as compared with a case in which there is no second magnetic shield cylinder. For that reason, in the case where a contour drawing is generated on the basis of the measured magnetic flux density, or a signal source position is estimated from a distribution chart, there is obtained a pattern that is different from the pattern distribution in the case where there is no shielding caused by the second magnetic cylinder, resulting in a problem that the estimated signal source position is displaced from an actual current source position. To solve this problem, there is provided calculating means for correcting a signal that is distorted by the second magnetic shield cylinder and obtained by the magnetic sensor. For example, a vertical component magnetic flux density signal amount in the case where there is no second magnetic shield cylinder is numerically corrected from a signal amount that is an actually detected vertical component by using a coefficient that is determined by values obtained by normalizing the distances of the respective sensors that detect the distorted magnetic flux density distribution from the center of the second magnetic shield cylinder by the diameter of the second magnetic shield cylinder, a distance between the open end surface of the second magnetic shield cylinder and the sensor mounted surface, the thickness and configuration of the magnetic material of the second magnetic cylinder, or the permeability. The coefficient used for numeric correction is calculated through simulation, or determined according to an experimental value of an actual apparatus structure.

The present invention is capable of structuring a magnetically shielding apparatus that is smaller in the size and higher in the shield efficiency than the conventional apparatus. In particular, (1) because the higher shield efficiency than that of the conventional art is obtained even in the case where the length of the cylinder of the first magnetically shielding apparatus is twice or less as long as the diameter of the opening portion, it is possible to realize the smaller magnetically shielding apparatus. (2) Also, it is possible to reduce an influence of distortion of the signal due to the magnetically shielding apparatus around the magnetic sensor.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

First Embodiment

Figure 1:
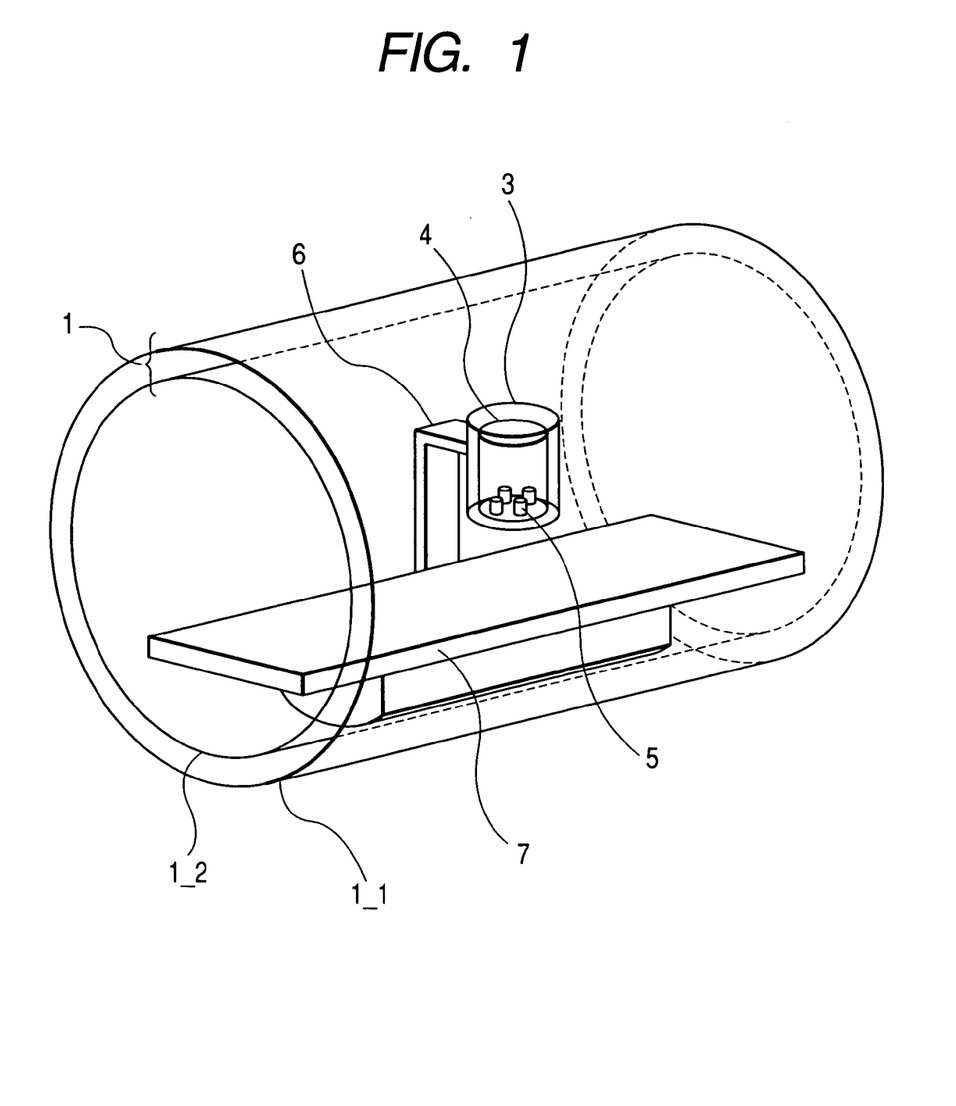
FIG. 1 is a perspective view showing the structure of a magnetic signal measurement apparatus according to a first embodiment of the present invention.
Figure 2:
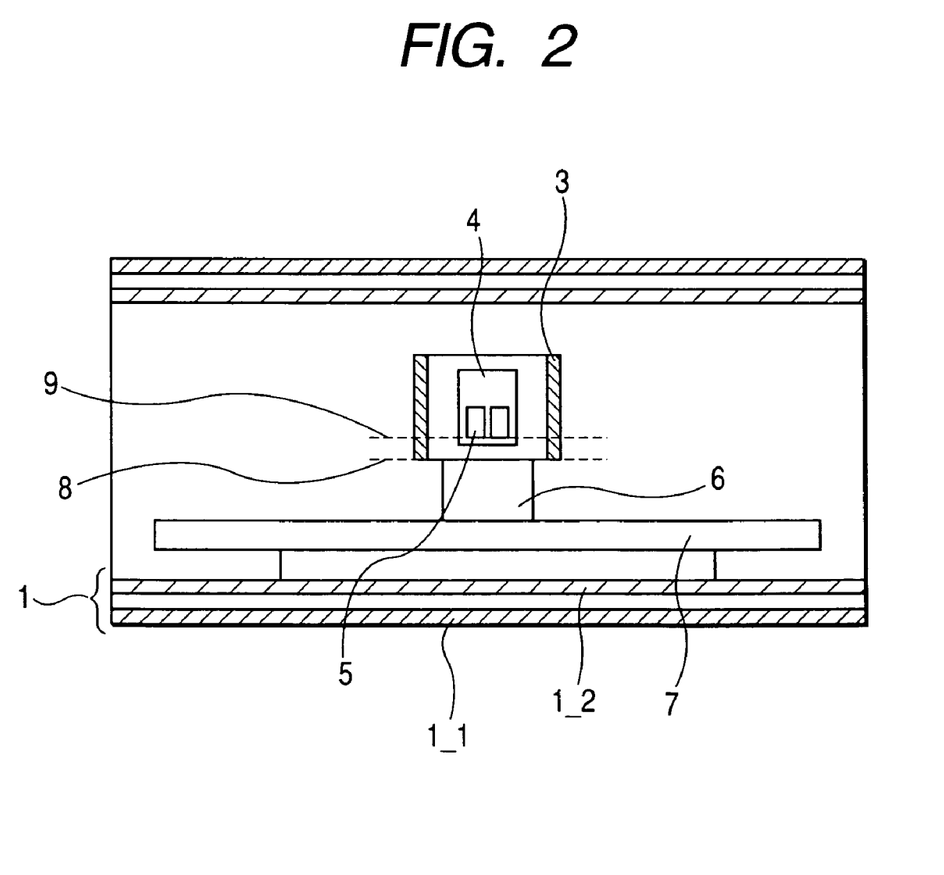
FIG. 2 is a cross-sectional view showing the structure of the magnetic signal measurement apparatus according to the first embodiment of the present invention.

FIG. 1 shows a perspective view of an embodiment in the case where a first magnetically shielding apparatus 1 is cylindrical, and a biomagnetism, mainly, a magnetic flux density that is generated from a heart is measured. The first magnetically shielding apparatus 1 is made up of a single or plural cylinders which are different in the diameter from each other and have both ends opened. In the first embodiment, the first magnetically shielding apparatus 1 is made up of a first cylinder 1_1 and a second cylinder 1_2. The respective cylinders that constitute the first magnetically shielding apparatus 1 overlap with each other in such a manner that the center axes of the respective cylinders are coaxial with each other. FIG. 1 shows an example in which the number of cylinders that constitute the first magnetically shielding apparatus 1 is two. However, since the magnetic shielding factor is determined according to the thicknesses, the lengths, and the diameters of the respective cylinders as the structure, the number of cylinders depends on the required shielding factor. As a general structure, the number of cylinders that constitute the first magnetically shielding apparatus 1 is appropriately 1 to 3. A cylinder that constitutes the first magnetically shielding apparatus 1 is made of permalloy and mumetal which mainly contain nickel and iron which are high permeability materials, and the relative permeability is about 40000 to 200000. The thicknesses of the respective cylinders that constitute the first magnetically shielding apparatus 1 are 0.5 mm to 3 mm, the diameters of the cylinders are 0.5 m to 2 m, and the lengths of the cylinders are about 1 m to 2 m. FIG. 2 shows a cross section of the structure according to a first embodiment. A second magnetically shielding apparatus 3 is disposed in the center of the first magnetically shielding apparatus 1, and the axial direction of the second magnetically shielding apparatus 3 is substantially perpendicular to the axial direction of the first magnetically shielding apparatus 1. The reason that the former is substantially perpendicular to the latter is because the magnetic shield effect caused by the second magnetically shielding apparatus 3 is the highest when they are perpendicularly disposed. Both ends of the cylinder of the second magnetically shielding apparatus 3 are open. Sensors 5 that measure the magnetic flux density of an object to be measured are disposed inside of the cylinder of the second magnetically shielding apparatus 3, and the magnetic signal measurement direction of the sensors 5 are disposed substantially in parallel to the axis of the second magnetically shielding apparatus 3. The reason that they are disposed substantially in parallel to each other is that the magnetic shield effect is the highest in the case where the measurement direction of the sensors 5 is in parallel to the axis of the second magnetically shielding apparatus 3, and also the measured magnetic signal can be readily corrected. Plural sensors 5 are disposed, and a sensor mounted surface is disposed internally by 10 mm to 50 mm from an open short surface of the second magnetically shielding apparatus 3 at a side of the object to be measured. The sensors are disposed within the dewar 4, and the shield effect is enhanced when the sensors are more internally disposed. However, when the sensors are extremely internally disposed, the distances between the sensors and a signal source are long, and the measurement signal is weakened. Therefore, the above distance is determined taking this fact into consideration.

In this embodiment, an SQUID (superconducting quantum interference device) is employed as a high sensitive magnetic flux density sensor. This technique is applicable to another magnetic flux density sensor, for example, a flux gate. Because the SQUID operates in a superconducting state, it is necessary to cool the SQUID at a low temperature. For that reason, the SQUID is disposed within the dewar 4, and then cooled by a refrigerant such as liquid nitrogen or liquid helium.

Figure 3:
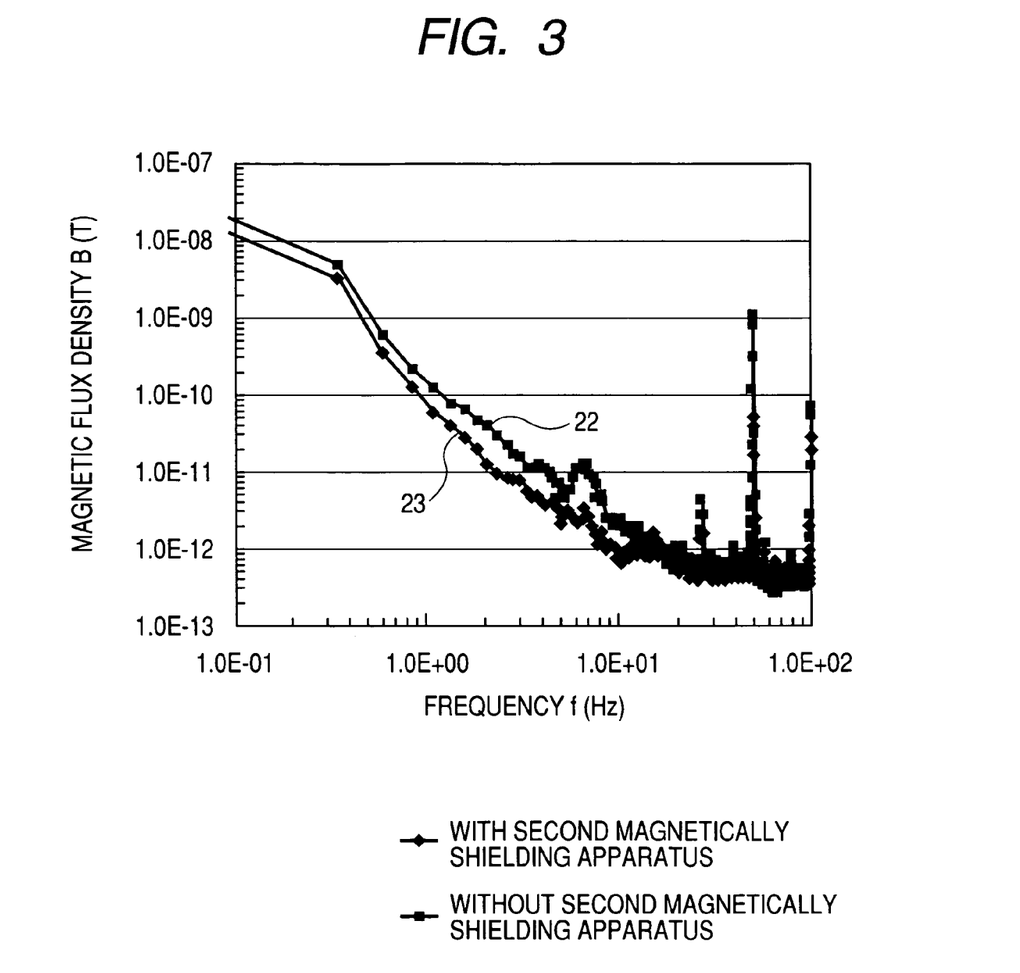
FIG. 3 is a graph showing the measurement result of an environmental magnetic noise of a cylindrical magnetically shielding apparatus that is actually produced.

FIG. 3 shows the measurement results of an environmental magnetic noise in the case where the second magnetically shielding apparatus 3 is located within a cylindrical magnetically shielding apparatus that is actually produced, and in the case the former is not located within the latter. In the drawing, the axis of ordinate represents the environmental magnetic flux density value, and the axis of abscissa represents a frequency component. The produced cylindrical magnetically shielding apparatus is made up of oblong double magnetically shielding apparatuses which are 1.6 m in the length. The opening portions are 1.4 m in the longer direction and 1.0 m in the shorter axial direction. An interval between the respective cylindrical walls is 0.1 m, the thickness of the magnetic material of the respective shield cylinder is 2 mm, and the relative permeability of the magnetic material is about 60000. The magnetic shielding factor of the cylindrical magnetically shielding apparatus is about 32 dB. The second magnetically shielding apparatus that is 0.4 m in the diameter, 0.6 m in the length, about 40000 in the relative permeability, and 2 mm in the thickness of the magnetic material is located in the center of the cylindrical magnetically shielding apparatus. In FIG. 3, a rhombus denotes an environmental magnetic noise spectrum 22 in the case where there is no second magnetically shielding apparatus, and a square denotes an environmental magnetic noise spectrum 23 in the case where there exists the second magnetically shielding apparatus. When the environmental magnetic noise spectrum 22 is compared with the environmental magnetic noise spectrum 23, the environmental magnetic noise spectrum 23 exhibits a magnetic flux density value about twice to five times as low as the environmental magnetic noise spectrum 22 in a frequency band of 10 Hz or lower. It is found that the magnetic shielding effect of the environmental magnetic noise is higher in the case where the second magnetically shielding apparatus 3 is located.

Figure 4:
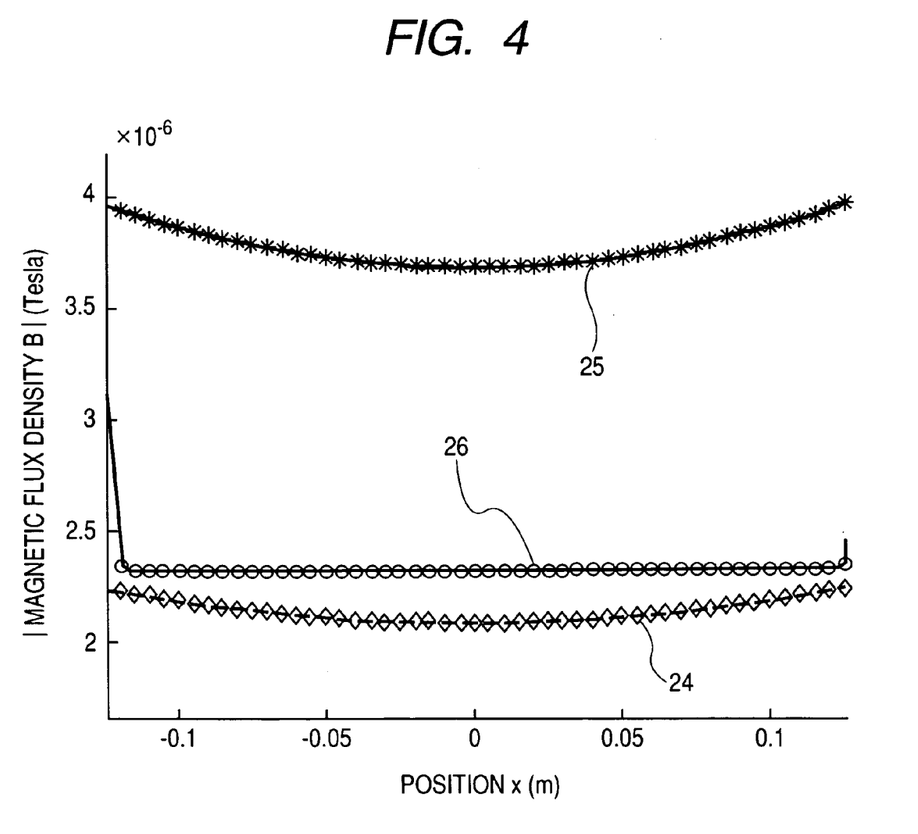
FIG. 4 is a graph showing the result of subjecting a magnetic flux density value within the magnetically shielding apparatus to numeric simulation.

FIG. 4 exhibits that the length of the first magnetically shielding apparatus 1 can be shortened while keeping the same magnetic shield effect by provision of the second magnetically shielding apparatus 3. Referring to FIG. 4, the axis of ordinate exhibits an absolute value of the magnetic flux density on the center axis of the first magnetically shielding apparatus 1, and a position x exhibits a position on the center axis of the first magnetically shielding apparatus 1 assuming that the center axis of the second magnetically shielding apparatus 3 is O. FIG. 4 shows the results obtained through the numeric simulation. The results are obtained under the simulation conditions where the relative permeability of the magnetic material is 40000, the thickness of the magnetic material 5 mm, the length of the first magnetically shielding apparatus 1 is 2 m and 1.6 m, the diameter of the first magnetically shielding apparatus 1 is 1 m, the length of the second magnetically shielding apparatus 3 is 0.5 m, the diameter of the second magnetically shielding apparatus 3 is 0.25 m, and the magnetic flux density of the exterior of the first magnetically shielding apparatus 1 is 300 nT. The external magnetic flux density applying direction is in parallel to the center axis of the first magnetically shielding apparatus. In the figure, a rhombus exhibits a magnetic flux density line 24 in the case where the length of the first magnetically shielding apparatus 1 is 2 m, and there is provided no second magnetically shielding apparatus 3, an asterisk exhibits a magnetic flux density line 25 in the case where the length of the first magnetically shielding apparatus 1 is 1.6 m, and there is provided no second magnetically shielding apparatus 3, and a circle exhibits a magnetic flux density line 26 in the case where the length of the first magnetically shielding apparatus 1 is 1.6 m, and there is provided the second magnetically shielding apparatus 3. The magnetic flux density lines of the circle and the rhombus are substantially equal to each other, and the flatness of the magnetic flux density is excellent. The results of FIG. 4 show that substantially the same magnetic field effect is obtained by provision of the second magnetically shielding apparatus 3 even when the length of the first magnetically shielding apparatus is shortened to 1.6 m from 2 m, and the magnetic shield effect that is high in the magnetic flux density flatness within the second magnetically shielding apparatus 3 is also obtained.

Figure 5:
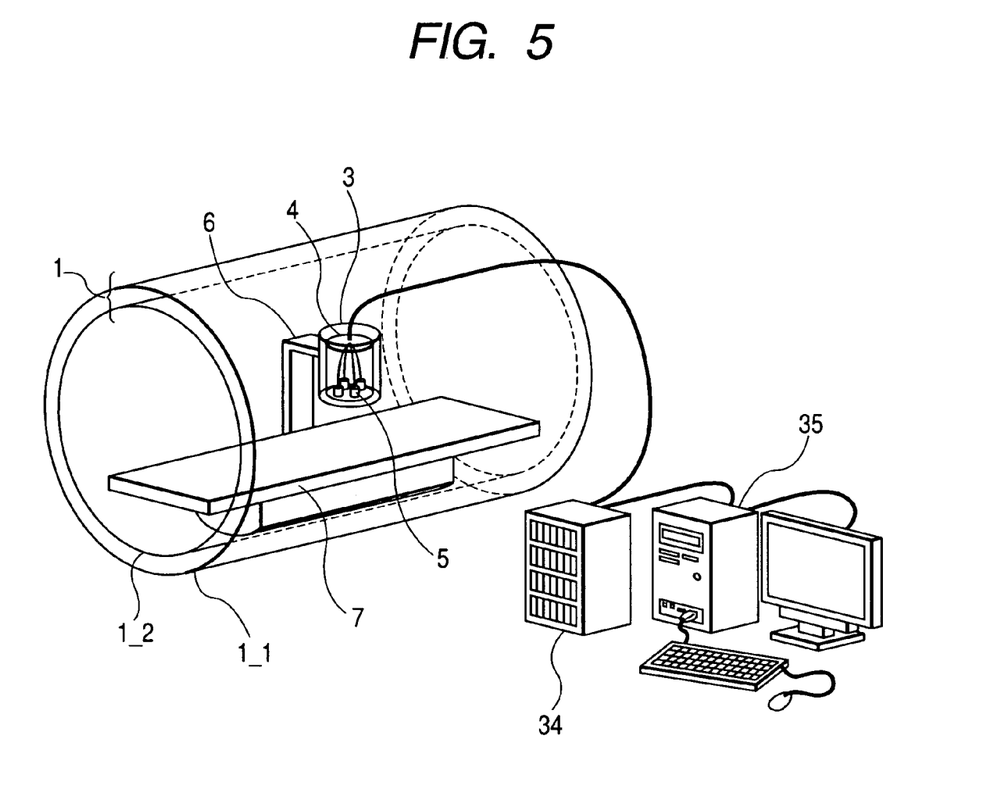
FIG. 5 is a perspective view showing the structure of a magnetic signal measurement apparatus including a sensor drive electronics and an acquisition and processing unit.

As shown in FIG. 5, the signal measurement is conducted by driving the sensors 5 through a sensor drive electronics 34, and recording and displaying the signals from the sensors 5 in an acquisition and processing unit 35. The sensor drive electronics 34 is controlled by the acquisition and processing unit 35.

Figure 6A:
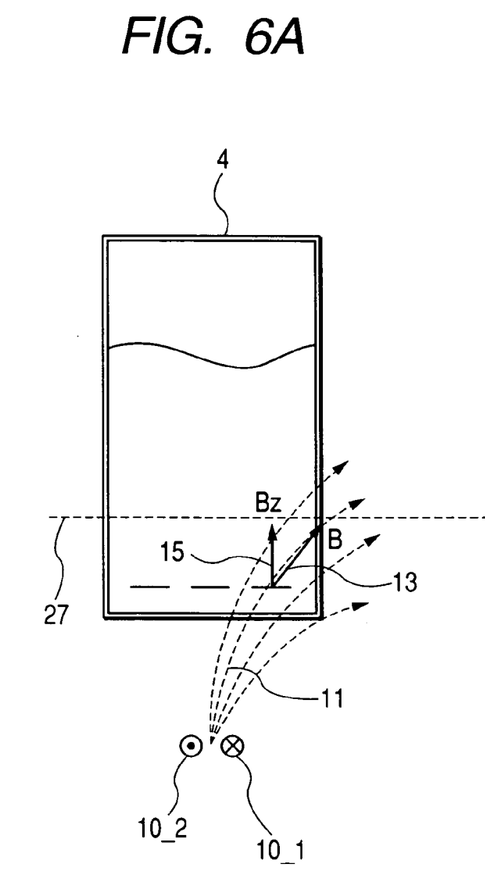
FIGS. 6A and 6B are schematic diagrams showing a state in which a second magnetically shielding apparatus distorts a measured magnetic flux density, respectively.
Figure 6B:
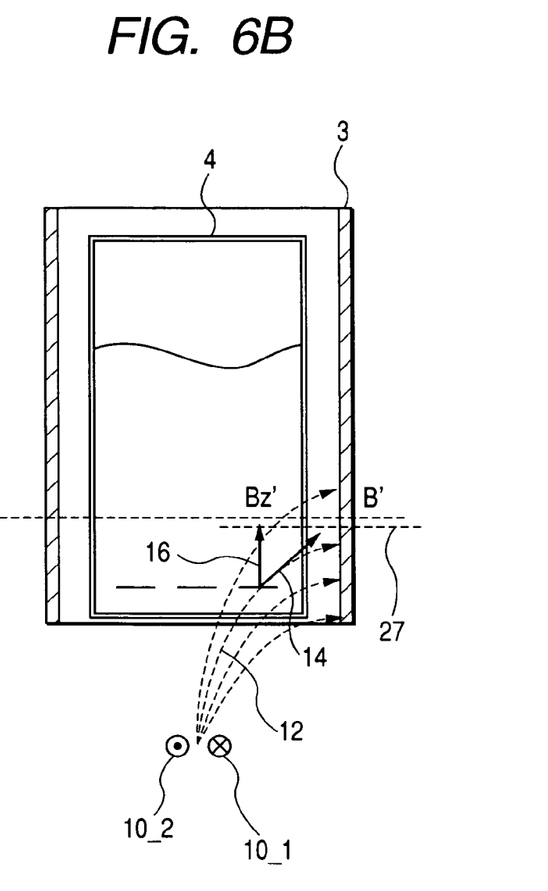

It is possible that the measured magnetic flux density further shields the magnetic noise outside of the first magnetically shielding apparatus 1 by provision of the second magnetically shielding apparatus 3. However, the magnetic flux density of an object to be measured, in particular, the magnetic flux density that is close to the second magnetically shielding apparatus 3 is distorted because the second magnetically shielding apparatus 3 is made of a high permeability material. The distorted magnetic flux density is schematically shown in FIGS. 6A and 6B. FIG. 6A shows the conventional structure having no second magnetically shielding apparatus 3, and FIG. 6B shows the structure having the second magnetically shielding apparatus 3. In a magnetic flux density occurring due to a signal source current 10_1 that flows from a front surface of the paper to a back surface thereof and a signal source current 10_2 that flows from the back surface of the paper to the front surface thereof, the magnetic flux density is indicated by magnetic force lines 11 in the case where there is no magnetically shielding apparatus, and indicated by magnetic force lines 12 in the case where there is the second magnetically shielding apparatus. A magnetic flux density component 13 at the sensor position in the case where there is no second magnetically shielding apparatus, a magnetic flux density component 14 at the sensor position in the case where there is the second magnetically shielding apparatus, a vertical magnetic flux density component 15 that is measured by the sensor in the case where there is no second magnetically shielding apparatus, and a vertical magnetic flux density component 16 that is measured by the sensor in the case where there is the second magnetically shielding apparatus are indicated by arrows. In the case where there is the second magnetically shielding apparatus 3, because the magnetic force lines 12 are attracted to the second magnetically shielding apparatus 3 that is made of the high permeability material, the magnetic force lines are bent horizontally as compared with the case where there is no second magnetically shielding apparatus 3. For that reason, the vertical magnetic flux density component 16 is reduced. In order to display a difference in the magnitude of the magnetic flux density components, an auxiliary line 27 indicative of the magnitude of the vertical magnetic flux density 15 in the case where there is no second magnetically shielding apparatus 3, and an auxiliary line 28 indicative of the magnitude of the vertical magnetic flux density 16 in the case where there is the second magnetically shielding apparatus 3 are represented in the figure.

Because a difference in the magnitude of the vertical magnetic flux density components due to the second magnetically shielding apparatus 3 causes an error in the signal source estimate and the distribution display, the vertical magnetic component is numerically corrected. The correcting process is conducted by the acquisition and processing unit 35. In the numerically correcting method, a radius dr of the second magnetically shielding apparatus 3 is normalized to set the radius dr to 1. It is assumed that a distance between the center axis 18 of the second magnetically shielding apparatus 3 and the sensor 5 is ds. It is assumed that a value of the magnetic flux density that is measured by the sensor 5 is Bz'.

Figure 7:
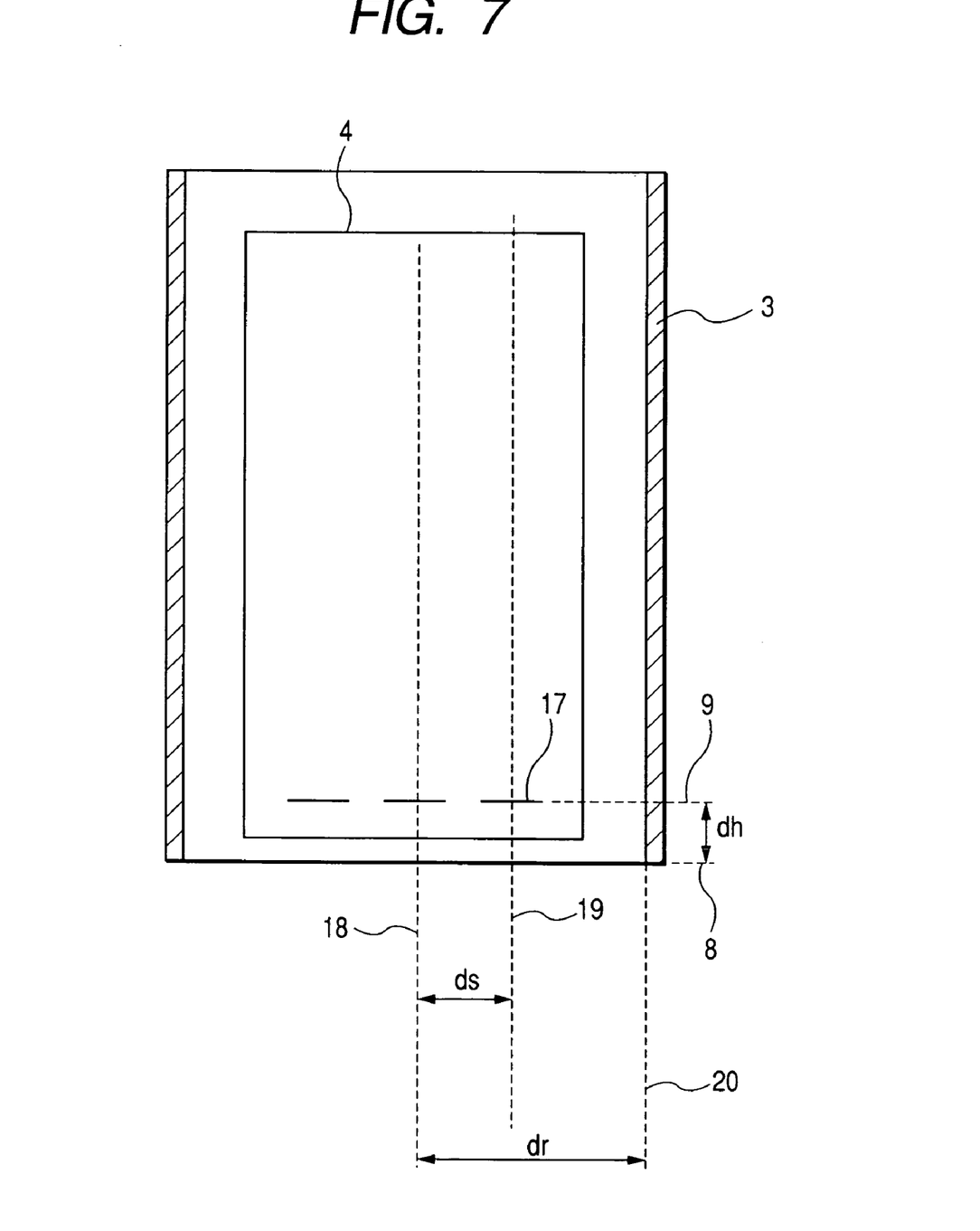
FIG. 7 is a diagram showing an arrangement of the second magnetically shielding apparatus and a sensor.

The correction magnetic flux density Bz in this case is calculated as a correction expression (Ex 1). FIG. 7 shows the position of the sensor 5, the radius dr of the second magnetically shielding apparatus 3, and the distance ds between the center axis 18 of the second magnetically shielding apparatus 3 and the sensor 5.

$$Bz = Bz' \times (\alpha + e^{(-(1-ds) \times \beta)})$$ (Ex 1)

In Ex 1, e is the base of natural logarithm. Values α and β are determined according to the size of the second magnetically shielding apparatus 3, the relative permeability of the magnetic material, the thickness of the magnetic material, and the distance dh between the opening end of the second magnetically shielding apparatus 3 at the side of the object to be measured and the sensor measurement surface. The determination is made by conducting numeric simulation or measuring the internal magnetic flux density distribution of the actually produced second magnetically shielding apparatus 3 with respect to the external magnetic flux density. In the simulation and the actual measurement method, a magnetic flux density generation coil 32 that is about 10 to 50 mm in the diameter is disposed in the center of the center axis of the second magnetically shielding apparatus at a distance from the measurement surface end of the second magnetically shielding apparatus 3 by about 10 to 100 mm, and the magnetic flux density within the second magnetically shielding apparatus 3 is calculated or measured. The values α and β in Ex. 1 are determined according to the calculated or measured results and the calculated or measured values of the magnetic flux density distribution in the case where there is no second magnetically shielding apparatus 3.

Figure 8:
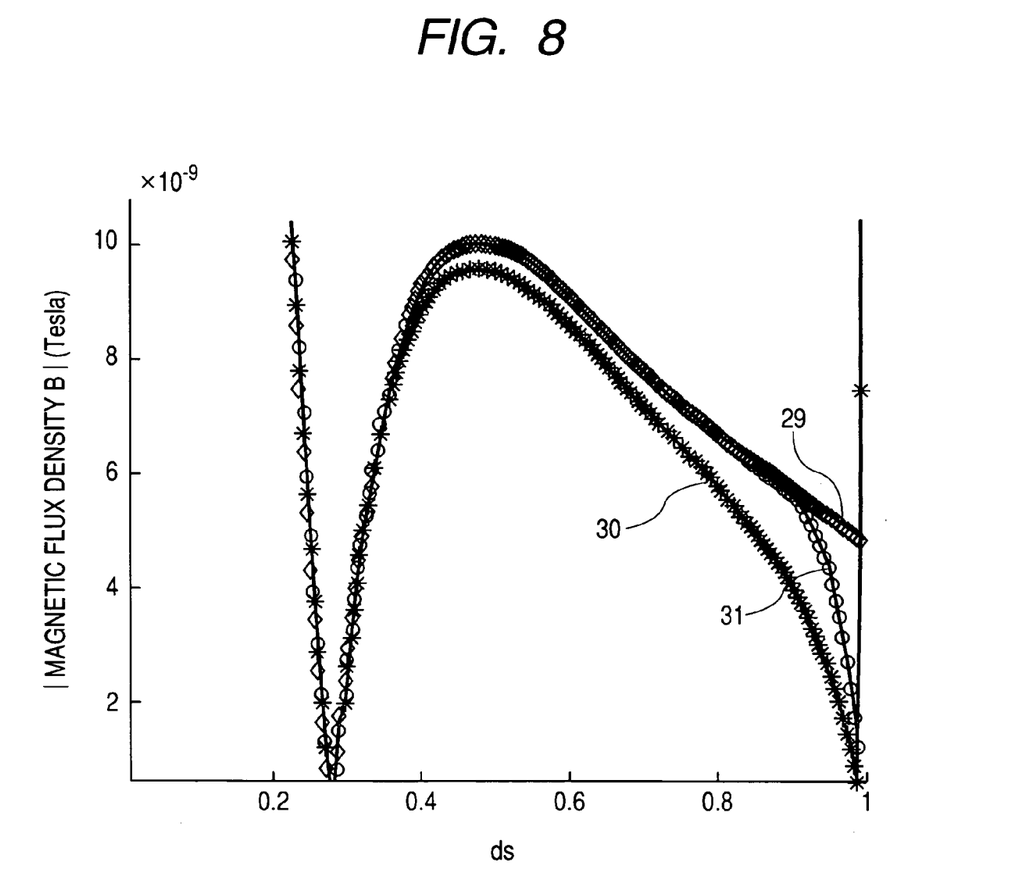
FIG. 8 is a graph showing a magnetic flux density simulation result of the second magnetically shielding apparatus.
Figure 9:
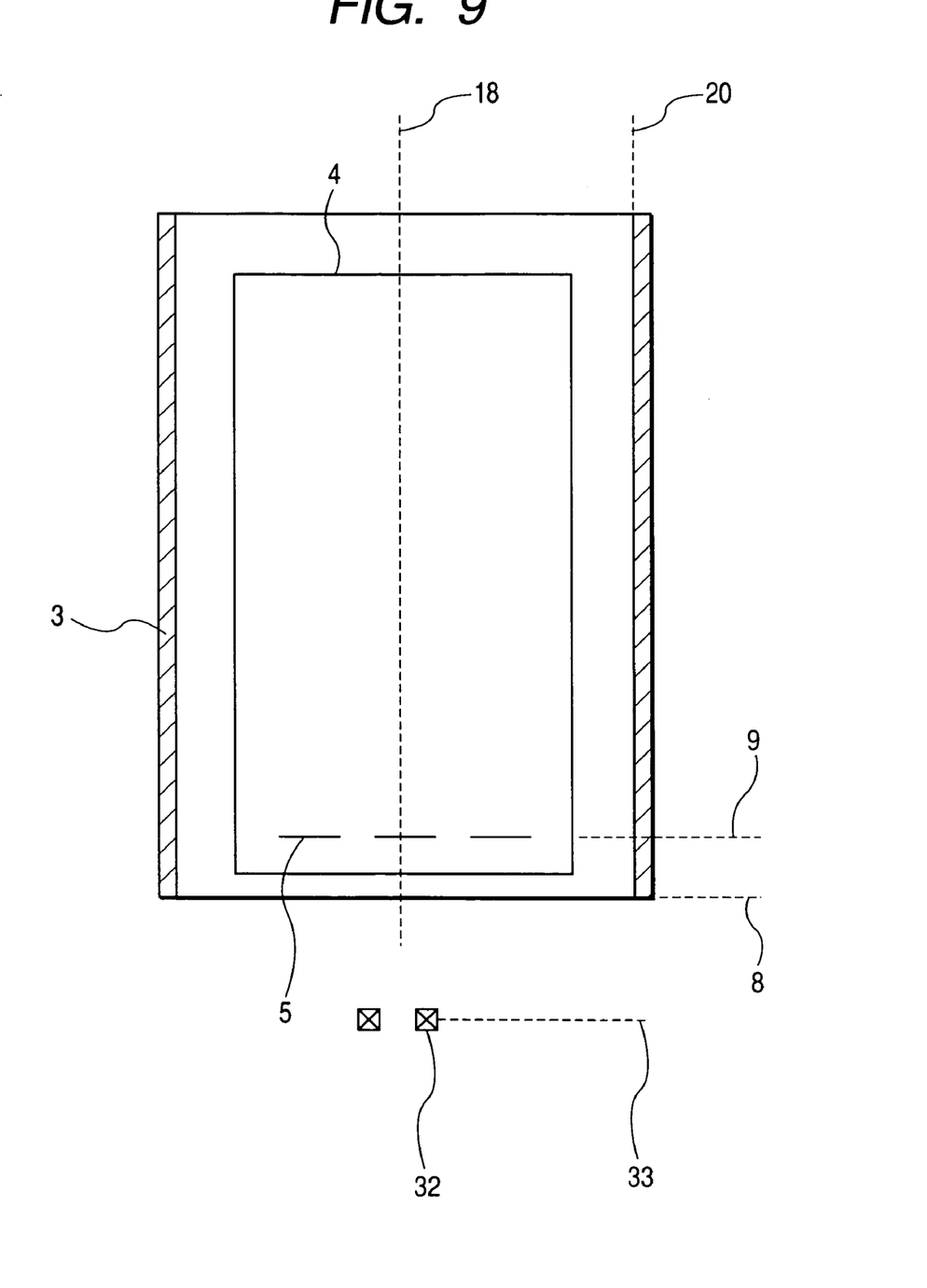
FIG. 9 is a diagram showing an arrangement where numeric simulation is conducted.

FIG. 8 shows the values that have been corrected by using Ex. 1 according to the magnetic simulation values in the cases where the second magnetically shielding apparatus 3 is employed and not employed, and the magnetic flux density values in the case where the second magnetically shielding apparatus 3 is employed. In FIG. 8, the axis of ordinate expresses the magnetic flux density values, and the axis of abscissa expresses the distances between the center axis of the normalized second magnetically shielding apparatus and the cylindrical wall of the second magnetically shielding apparatus, and takes values of 0 to 1. Although the magnetic flux density values in the axis of ordinate have the polarities, FIG. 8 indicates absolute values for facilitation of comparing the magnitudes of the magnetic flux density values with each other. In FIG. 8, a line indicated by a rhombus is a magnetic flux density simulation value 29 in the case where there is no second magnetically shielding apparatus 3, a line indicated by an asterisk is a magnetic flux density simulation value 30 in the case where there is the second magnetically shielding apparatus 3, and a circle is a simulation magnetic flux density value 31 that has been corrected by Ex. 1. FIG. 9 is a cross-sectional view showing the arrangement of the second magnetically shielding apparatus 3, the sensor 5, and the magnetic flux density generation coil 32 by which the numeric simulation shown in FIG. 8 is conducted. The simulation conditions are that the relative permeability of the second magnetically shielding apparatus 3 is 40000, the radius of the cylinder of the second magnetically shielding apparatus 3 is 200 mm, the thickness of the cylinder of the second magnetically shielding apparatus 3 is 1 mm, the length of the cylinder of the second magnetically shielding apparatus 3 is 400 mm, a distance between an auxiliary line 8 indicative of the measurement surface side end of the second magnetically shielding apparatus 3 and an auxiliary line 9 indicative of the measurement surface of the sensor 5 is 15 mm, the diameter of the magnetic flux density generation coil 32 is 10 mm, the number of windings of the magnetic flux density generation coil 32 is 1, a distance between a coil surface 33 of the magnetic flux density coil 32 and the auxiliary line 8 indicative of the measurement surface side end of the second magnetically shielding apparatus 3 is 55 mm, the coil axis of the magnetic flux density generation coil 32 is coaxial with the axis of the cylinder of the second magnetically shielding apparatus 3, and a current value that flows in the magnetic flux density generation coil 32 is 1 nA. The coefficients α and β in Ex. 1 under the above conditions are α=1.05, β=11, respectively. As a result, as shown in FIG. 8, in the case where there is the second magnetically shielding apparatus 3, there exists little difference between the magnetic flux density simulation value 29 in the case where there is no second magnetically shielding apparatus 3 and the simulation magnetic flux density value 30 in the case where there is the second magnetically shielding apparatus 3 when the distance ds between the auxiliary line 18 indicative of the center axis of the second magnetically shielding apparatus and the auxiliary line 20 indicative of the measurement point of the sensor 5 is 0.3 or less in the case where the distance dr between the auxiliary line 18 indicative of the center axis of the second magnetically shielding apparatus and the auxiliary line 20 indicative of the cylindrical wall of the second magnetically shielding apparatus is normalized as 1. However, when the distance ds exceeds 0.3, the difference starts to occur, and the distance becomes larger as the auxiliary line 18 more approaches the auxiliary line 20 indicative of the cylindrical wall of the second magnetically shielding apparatus (that is, ds is 1). On the other hand, the simulation magnetic flux density value 3 that has been corrected by Ex. 1 coincides with the magnetic flux density simulation value 29 in the case where there is no second magnetically shielding apparatus 3 when the distance ds is 0.9 or less. Accordingly, in the case of using the correction expression of Ex. 1, the sensors 5 are arranged with the limit that the distance ds is 0 to 0.9.

Second Embodiment

Figure 10:
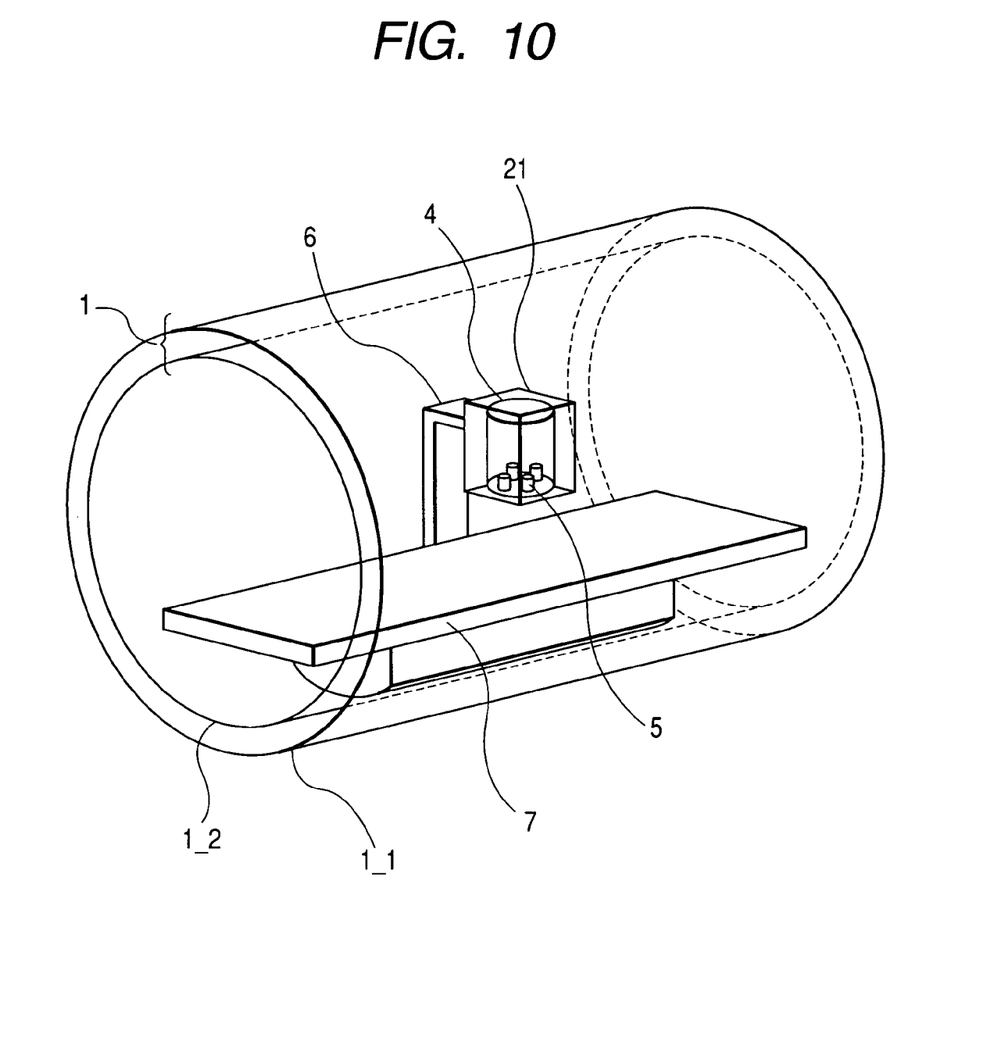
FIG. 10 is a perspective view showing the structure of a magnetic signal measurement apparatus according to a second embodiment of the present invention.

FIG. 10 shows a perspective view of another embodiment in the case where a second magnetically shielding apparatus 21 is cylindrical, and a biomagnetism, mainly, a magnetic flux density that is generated from a heart is measured. The first magnetically shielding apparatus 1 is made up of a single or plural cylinders which are different in the diameter from each other and have both ends opened. In the second embodiment, the first magnetically shielding apparatus 1 is made up of a first cylinder 1_1 and a second cylinder 1_2. The respective cylinders that constitute the first magnetically shielding apparatus 1 overlap with each other in such a manner that the center axes of the respective cylinders are coaxial with each other. FIG. 10 shows an example in which the number of cylinders that constitute the first magnetically shielding apparatus 1 is two. However, since the magnetic shielding factor is determined according to the thickness, the length, and the diameter of the respective cylinders as the structure, the number of cylinders depends on the required shielding factor. As a general structure, the number of cylinders that constitute the first magnetically shielding apparatus 1 is appropriately 1 to 3. A cylinder that constitutes the first magnetically shielding apparatus 1 is made of permalloy and mumetal which mainly contain nickel and iron which are high permeability materials, and the relative permeability is about 40000 to 200000. The thicknesses of the respective cylinders that constitute the first magnetically shielding apparatus 1 are 0.5 mm to 3 mm, the diameters of the cylinders are 0.5 m to 2 m, and the lengths of the cylinders are about 1 m to 2 m.

FIG. 10 shows a structural diagram of a case in which the cylindrical configuration of the second magnetically shielding apparatus 21 consists of four planes, and a cross section that is perpendicular to the axis of the cylinder is square. In FIG. 10, the cross section of the second magnetically shielding apparatus is square, but the sectional configuration of the second magnetically shielding apparatus 21 is not limited to only the square, but is realized by a polygonal cylinder. The magnetic shield effect is the same as that in the first embodiment, and a method of correcting the distortion of the magnetic flux density within the second magnetically shielding apparatus 21 can be also conducted by the same manner as that in the first embodiment. The magnetic shield effect is obtained when the second magnetically shielding apparatus 21 is so configured as to shield the magnetic sensor 5. However, taking the facilitation of calculating the distortion correction into consideration, it is desirable that the second magnetically shielding apparatus 21 is of a cylindrical configuration that is in parallel to the magnetic sensor 5, and the cross section of the cylinder is circular or regular polygonal.

Third Embodiment

Figure 11:
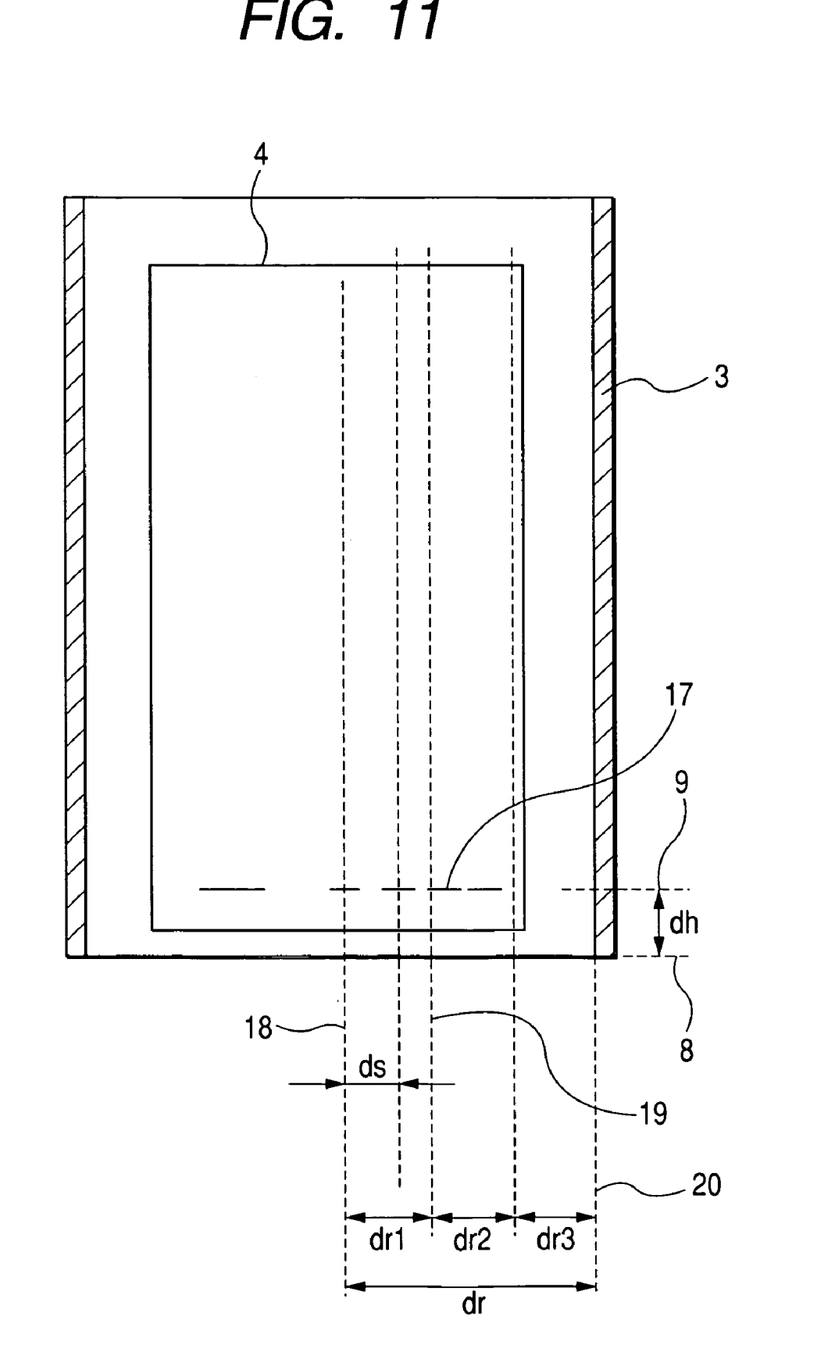
FIG. 11 is a diagram showing an arrangement of a magnetically shielding apparatus and a sensor when a correction region is divided into plural sections according to a third embodiment of the present invention.

FIG. 11 shows a case in which a correction region is divided into plural regions, and the correction expression is approximated by a pronominal expression of the distance in the respective regions to conduct the correction. In the drawing, the correction region is divided into three regions. In the numeric correction that is conducted by the acquisition and processing unit 35, the radius dr of the second magnetically shielding apparatus 3 is normalized, and the radius dr is set to 1. The radius dr is divided into three regions which are denoted by $dr_1$, $dr_2$, and $dr_3$ in the order of the cylindrical walls from the center axis of the second magnetically shielding apparatus 3. The correction magnetic flux densities within the respective regions are $Bz_1$, $Bz_2$, and $Bz_3$ in the order of the cylindrical walls from the center axis of the second magnetically shielding apparatus 3. A distance between the center axis 18 of the second magnetically shielding apparatus 3 and the center 5 is ds. A value of the magnetic flux density which is measured by the sensor 5 is Bz'.

In this case, the correction magnetic flux density Bz is calculated in the region $dr_1$ as a correction expression (Ex. 2), in region $dr_2$ as a correction expression (Ex. 3), and in region $dr_3$ as a correction expression (Ex. 4). FIG. 7 shows the position of the sensor 5, the radius dr of the second magnetically shielding apparatus 3, and the distance ds between the center axis 18 of the second magnetically shielding apparatus 3 and the sensor 5.

$$Bz_1 = Bz' \times (\alpha_1 \times ds^2 + \beta_1 \times ds + \gamma_1) \qquad \text{(Ex. 2)}$$

$$Bz_2 = Bz' \times (\alpha_2 \times ds^2 + \beta_2 \times ds + \gamma_2) \qquad \text{(Ex. 3)}$$

$$Bz_3 = Bz' \times (\alpha_3 \times ds^2 + \beta_3 \times ds + \gamma_3) \qquad \text{(Ex. 4)}$$

In Ex. 2, Ex. 3, and Ex. 4, values $\alpha_1$, $\beta_1$, $\gamma_1$, $\alpha_2$, $\beta_2$, $\gamma_2$, $\alpha_3$, $\beta_3$, and $\gamma_3$ are determined according to the size of the second magnetically shielding apparatus 3, the relative permeability of the magnetic material, the thickness of the magnetic material, and the distance dh between the opening end of the second magnetically shielding apparatus 3 at the side of the object to be measured and the sensor measurement surface. The determination is made by conducting numeric simulation or measuring the internal magnetic flux density distribution of the actually produced second magnetically shielding apparatus 3 with respect to the external magnetic flux density. In the simulation and the actual measurement method, the magnetic flux density generation coil 32 that is about 10 to 50 mm in the diameter is disposed in the center of the center axis of the second magnetically shielding apparatus at a distance from the measurement surface end of the second magnetically shielding apparatus 3 by about 10 to 100 mm, and the magnetic flux density within the second magnetically shielding apparatus 3 is calculated or measured. The values $\alpha_1$, $\beta_1$, $\gamma_1$, $\alpha_2$, $\beta_2$, $\gamma_2$, $\alpha_3$, $\beta_3$ and $\gamma_3$ in Ex. 2, Ex. 3, and Ex. 4 are determined according to the calculated or measured results and the calculated or measured values of the magnetic flux density distribution in the case where there is no second magnetically shielding apparatus 3. In the third embodiment, the region of dr is divided into three regions, and the same correction can be conducted even though the region of dr is divided into any regions. In general, the region of dr is appropriately divided into 2 to 4 regions. In addition, the value of the magnetic flux density which is measured by the sensor 5 is corrected by multiplying Bz' by the two-dimensional function of ds. Alternatively, the multidimensional function can be applied. In general, two-dimensional or three-dimensional function is appropriate. The advantage of dividing the correction region into plural regions is to improve a precision of the correction approximation.

Fourth Embodiment

In a numeric correction that is conducted by the acquisition and processing unit 35, as a method of conducting numeric simulation or measuring the internal magnetic flux density distribution of the actually produced second magnetically shielding apparatus 3 with respect to the external magnetic flux density for determining the coefficients $\alpha$ and $\beta$, and $\alpha_1$, $\beta_1$, $\gamma_1$, $\alpha_2$, $\beta_2$, $\gamma_2$, $\alpha_3$, $\beta_3$, $\gamma_3$ in Ex1, Ex2, Ex3, and Ex4, a uniform magnetic flux density that is in parallel to the axis of the second magnetically shielding apparatus 3 is applied to the exterior of the second magnetically shielding apparatus by using helmholtz coils having a diameter that is larger than the diameter and length of the second magnetically shielding apparatus 3 to calculate or measure the magnetic flux density distribution within the second magnetically shielding apparatus.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A magnetic signal measurement apparatus, comprising:
    a first magnetically shielding apparatus having a cylindrical configuration whose both ends are opened;
    a single or a plurality of magnetic sensors whose magnetic detection direction is substantially orthogonal to an axial direction of the cylinder of the first magnetically shielding apparatus, and which is disposed within the first magnetically shielding apparatus;
    a second magnetically shielding apparatus which has a cylindrical configuration with both ends or one direction close to an object to be measured being opened, which has an axial direction of the cylinder substantially in parallel to the magnetic flux density detection direction, which is disposed within the first magnetically shielding apparatus, and which has the magnetic sensor disposed within the cylinder; and
    acquisition and processing means for correcting a signal that is distorted by the second magnetically shielding apparatus and obtained by the magnetic sensor.

2. The magnetic signal measurement apparatus according to claim 1, wherein the second magnetically shielding apparatus has a circular or polygonal cylindrical configuration.

3. The magnetic signal measurement apparatus according to claim 1, wherein the acquisition and processing means conducts the correction by multiplying the signal that is obtained by the magnetic sensor by a function that is determined according to a position of the magnetic sensor.

4. The magnetic signal measurement apparatus according to claim 1, wherein the acquisition and processing means subjects each of the regions within the second magnetically shielding apparatus to a different correction operation.

5. The magnetic signal measurement apparatus according to claim 1, wherein the magnetic sensor is disposed so that the opening end of the magnetic sensor is positioned at 10 mm to 50 mm from the opening end of the second magnetically shielding apparatus toward the interior of the second magnetically shielding apparatus.

6. The magnetic signal measurement apparatus according to claim 1, wherein the magnetic sensor is disposed within a range of 0 to 0.9 when the position of the center axis of the second magnetically shielding apparatus is 0, and the position of the cylindrical wall is normalized as 1.

7. The magnetic signal measurement apparatus according to claim 1, wherein the first and second magnetically shielding apparatuses are made of high permeability material.

8. The magnetic signal measurement apparatus according to claim 7, wherein the high permeability material is permalloy and mumetal.

9. The magnetic signal measurement apparatus according to claim 1, wherein the first magnetically shielding apparatus is of a cylinder, and the length of the cylinder is shorter than twice as long as the diameter of the cylinder.

* * * * *